United States Patent
El-Kik

(10) Patent No.: US 7,342,983 B2
(45) Date of Patent: Mar. 11, 2008

(54) APPARATUS AND METHOD FOR DIGITALLY FILTERING SPURIOUS TRANSITIONS ON A DIGITAL SIGNAL

(75) Inventor: Tony S. El-Kik, Allentown, PA (US)

(73) Assignee: Agere Systems, Inc., Allentown, PA (US)

( * ) Notice: Subject to any disclaimer, the term of this patent is extended or adjusted under 35 U.S.C. 154(b) by 790 days.

(21) Appl. No.: 10/785,682

(22) Filed: Feb. 24, 2004

(65) Prior Publication Data

US 2005/0185709 A1    Aug. 25, 2005

(51) Int. Cl.
*H04B 1/10* (2006.01)
(52) U.S. Cl. .................. 375/350; 375/229; 708/301; 708/323; 708/322
(58) Field of Classification Search ......... 375/350, 375/229; 708/301, 323, 322
See application file for complete search history.

(56) References Cited

U.S. PATENT DOCUMENTS

| | | | |
|---|---|---|---|
| 3,829,798 A | * | 8/1974 | Byram et al. .............. 333/166 |
| 5,457,718 A | * | 10/1995 | Anderson et al. .......... 375/373 |
| 6,064,704 A | * | 5/2000 | Liu et al. .................. 375/350 |
| 2005/0105507 A1 | * | 5/2005 | Clements et al. .......... 370/351 |

* cited by examiner

*Primary Examiner*—Phuong Phu
(74) *Attorney, Agent, or Firm*—Daniel J. Santos

(57) ABSTRACT

A digital filtering apparatus and method for digitally filtering out undesirable or invalid data from data signal lines. The digital filtering apparatus includes a digital delay element having one or more outputs, a comparator connected to the outputs of the digital delay element, and a final stage connected to the output of the comparator and the outputs of the digital delay element. The digital filtering apparatus recognizes and filters out invalid data from data received by the digital delay element, and allows valid data to pass through the filter. Data is considered invalid data if its logical data state transition has a duration less than the clock setting of the digital filtering apparatus. The clock setting can be established by the number of active delay components in the digital delay element. The inventive digital filtering apparatus represents an improvement over conventional analog filters, e.g., in manufacturing efficiency and filtering performance.

12 Claims, 3 Drawing Sheets

APPARATUS AND METHOD FOR DIGITALLY FILTERING SPURIOUS TRANSITIONS ON A DIGITAL SIGNAL

BACKGROUND OF THE INVENTION

1. Field of the Invention

The invention relates to digital filtering circuitry. More particularly, the invention relates to digital circuitry that filters undesirable or invalid data from data signal lines.

2. Description of the Related Art

Filters and filtering circuitry have many uses in modern electronic devices, circuits and systems. One such use is to recognize or filter undesirable or invalid data on data signal lines. Invalid data includes, e.g., logical state transitions (i.e., low to high and high to low data transitions) whose duration is greater than desired. Conventional filters or other arrangements used to filter invalid data include analog filters, which typically comprise filtering arrangements that include one or more analog components. For example, a conventional RC filter circuit eliminates high to low transitions depending on the RC value. However, in general, it is relatively cumbersome to design and manufacture an analog filter, and the quality and performance of analog filters often depend on the filter manufacturing process. For example, the existence of leakage current and the variability of capacitor and resistor values due to process parameters such as voltage and temperature often greatly affect the operation and performance of analog filters. Moreover, conventionally, it has been relatively difficult to manufacture an analog filter that adequately recognizes or filters invalid data on data signal lines and reduces or minimizes the rise and fall time of the output filtered signal. Accordingly, such conventional filters are unsuitable for use in devices and systems that can not tolerate such delays.

Accordingly, it would be desirable to have available an all-digital circuit that filters invalid data on data signal lines while overcoming the shortcomings of conventional filters including analog filters.

SUMMARY OF THE INVENTION

The invention is embodied in a digital filtering apparatus and method for digitally filtering out undesirable or invalid data, e.g., from data signal lines. The digital filtering apparatus includes a digital delay element having one or more outputs, a comparator operably connected to the outputs of the digital delay element, and a final stage operably connected to the output of the comparator and the outputs of the digital delay element. In operation, the digital filtering apparatus recognizes and filters out invalid data among data received by the digital delay element, thus allowing the valid data to pass through the filter. Data is considered to be valid data if its logical data state transition has a duration greater than the clock setting of the digital filtering apparatus. The clock setting is established, e.g., by the number of active delay components (e.g., flip-flops) in the digital delay element and the corresponding number of active comparator inputs connected to the outputs of the active delay components. Thus, the bandwidth of the digital filtering apparatus is increased or decreased, e.g., by increasing or decreasing, respectively, the number of active delay components in the digital delay element. The inventive digital filtering apparatus represents an improvement over conventional analog filters, e.g., in manufacturing efficiency and filtering performance.

BRIEF DESCRIPTION OF THE DRAWINGS

FIG. 2 is a timing diagram associated with the operation of the digital filtering apparatus circuit shown in FIG. 1; and FIG. 3 is another timing diagram associated with the operation of the digital filtering apparatus circuit shown in FIG. 1.

DETAILED DESCRIPTION OF EXEMPLARY EMBODIMENTS

Figure 1:
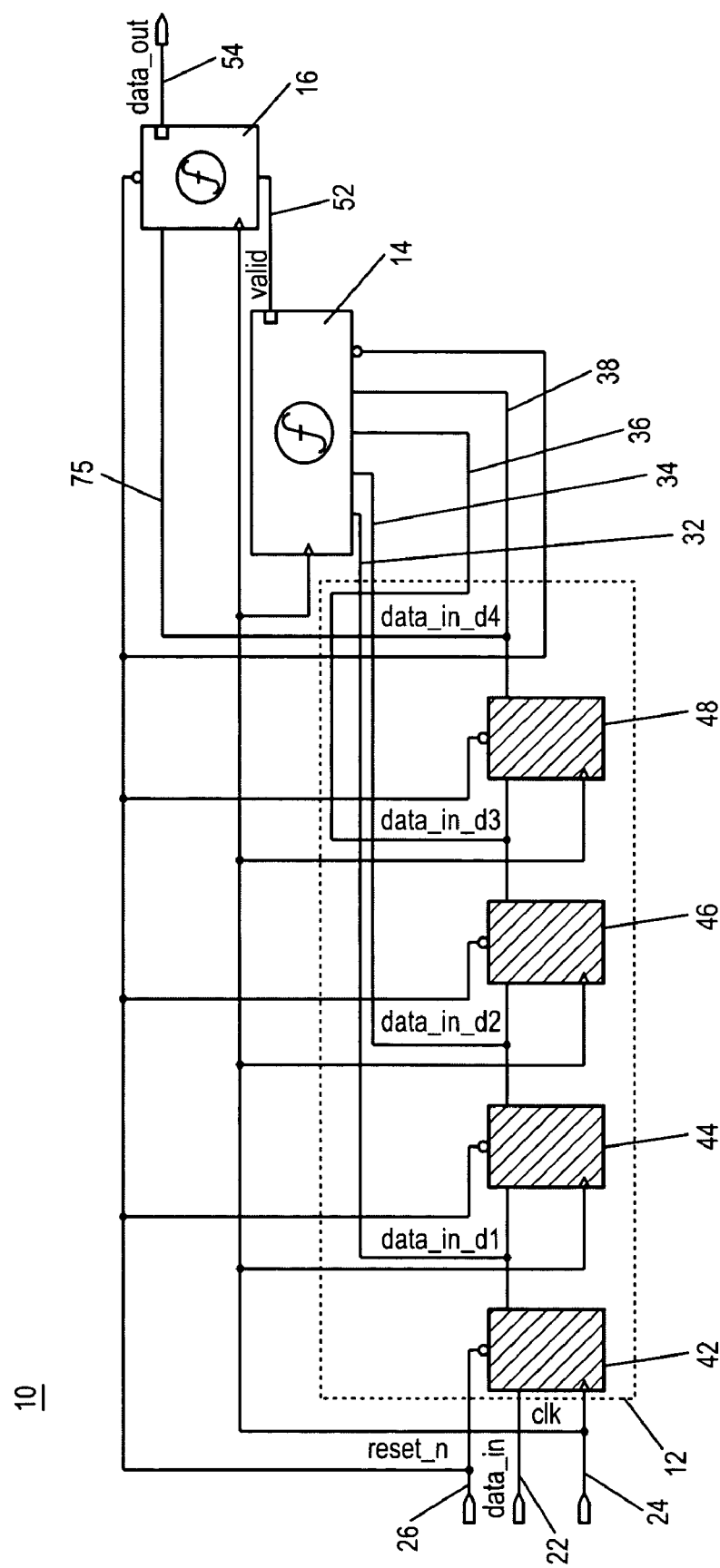
FIG. 1 is a schematic view of a digital filtering apparatus according to an embodiment of the invention.
Figure 1:
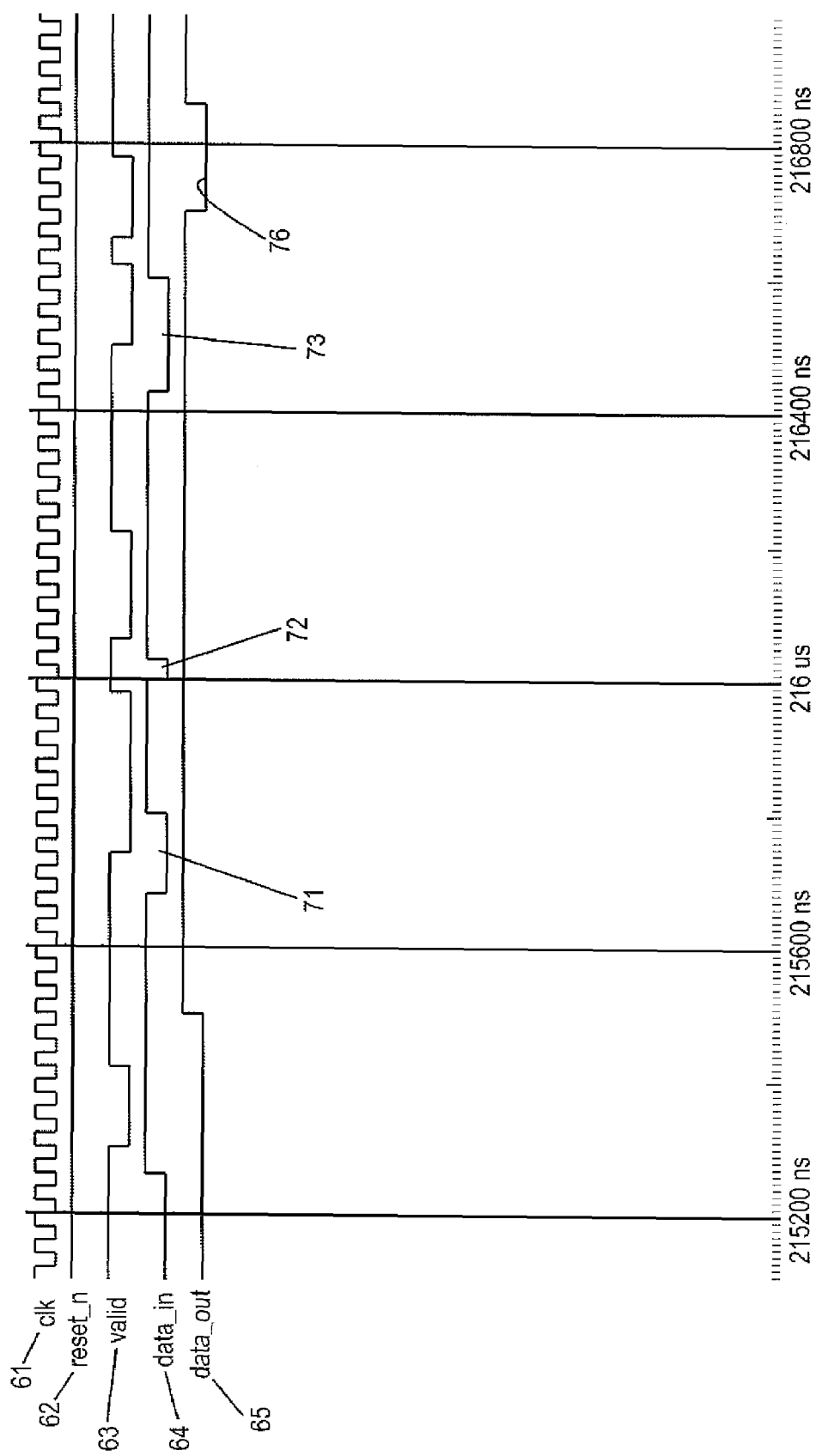
Figure 1:
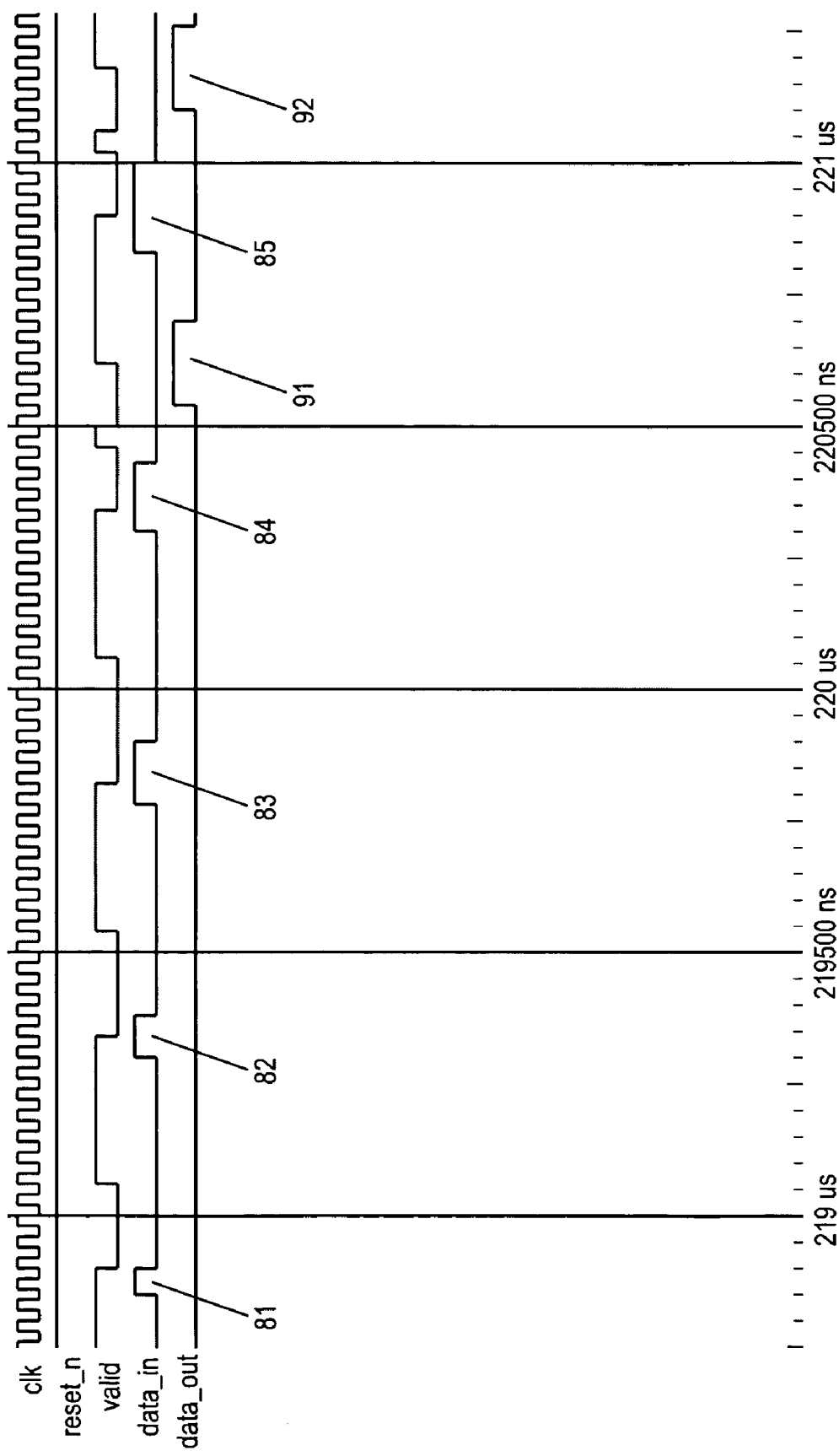

In the following description like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Referring now to FIG. 1, shown is a schematic view of a digital filtering apparatus 10 according to an embodiment of the invention. The digital filtering apparatus 10 includes a digital delay element (shown generally as 12), a comparator 14 operably connected to the digital delay element 12 and a final stage 16 operably connected to both the digital delay element 12 and the comparator 14.

The digital delay element 12 has a data input or data input line 22, which also functions as the data signal line for the digital filtering apparatus 10. The digital delay element 12 also includes, e.g., a clock input or clock input line 24, a pre-set input or pre-set input line 26, and one or more outputs or output lines, e.g., output lines 32, 34, 36, 38.

According to an embodiment of the invention, the digital delay element 12 includes a plurality of individual delay components 42, 44, 46, 48, e.g., a plurality of shift registers or flip-flops. Although four flip-flops are shown in FIG. 1, the digital filtering apparatus 10 according to embodiments of the invention has any suitable number of flip-flops or other individual delay components as necessary to provide the desired amount of data delay through the digital delay element 12. As will be discussed in greater detail hereinbelow, for a desired delay of n clock cycles, the digital delay element has n+1 delay elements.

In this embodiment of the invention, the flip-flops are connected in series, e.g., as shown. That is, the output of a first flip-flop, e.g., the flip-flop 42, is connected to the input of a second flip-flop, e.g., the flip-flop 44, the output of the second flip-flop 44 is connected to the input of a third flip-flop, e.g., the flip-flop 46, and so on. The input of the first flip-flop is the data signal line 22. Also, as shown, the clock input line 24 is connected to each flip-flop and the reset input line 26 is connected to each flip-flop.

The output lines 32, 34, 36, 38 from the digital delay element 12 also serve as the input lines to the comparator 14. The comparator 14 has any suitable number of input lines, however, the number of active input lines of the comparator 14 typically coincides with the number of output lines from the individual delay components of the digital delay element 12 (i.e., in this embodiment, the individual flip-flops 42, 44, 46, 48). That is, in this embodiment, the digital delay element 12 has four output lines 32, 34, 36, 38, thus the comparator 14 has 4 active inputs regardless of the number of available inputs. The comparator 14 also includes an output line 52, which also serves as an enable line for the final stage 16. Also, as shown, both the clock input line 24 and the pre-set input line 26 are connected to the comparator 14.

The final stage 16 includes, e.g., a latch or other suitable component or components. The final stage 16 has an enable input connected to the enable line 52 of the comparator 14, and a data input connected to the output of the final delay component of the digital delay element 12, i.e., the flip-flop 48. Also, both the clock input line 24 and the reset input line 26 are connected to the final stage 16. The final stage 16 also includes an output line 54, which also serves as the filtered output of the digital filtering apparatus 10.

According to embodiments of the invention, the digital filtering apparatus 10 determines or recognizes undesirable or invalid data (e.g., data spikes) on the data signal line and filters out the invalid data. Thus, valid data passes through the digital filtering apparatus 10.

For purposes of discussion herein, undesirable data or invalid data refers to any data that changes logical data state for a time period or duration less than the clock cycle setting. The clock cycle setting is determined generally by the number of individual delay components (e.g., flip-flops) in the digital delay element 12. More specifically, in the specific digital delay element 12 shown in FIG. 1, the clock cycle setting is the number of individual delay components, minus 1. For example, in the embodiment of the invention shown in FIG. 1, the digital delay element 12 has 4 flip-flops, thus the clock cycle setting is 4−1, or 3 clock cycles. Accordingly, invalid data is any data being clocked through the digital delay element 12 that has a change in logical data state of less than 3 clock cycles, i.e., the duration the of the logical data state change is less than 3 clock cycles.

As discussed briefly hereinabove, the digital delay element 12 has any suitable number of individual delay components. The bandwidth of the digital filtering apparatus 10 (i.e., the clock cycle setting) is increased by including more flip-flops or other individual delay components in the digital delay element 12. Similarly, the bandwidth of the digital filtering apparatus 10 is decreased by including less individual delay components in the digital delay element 12. Again, for a bandwidth of n clock cycles, the digital delay element 12 has n+1 individual delay components.

As discussed hereinabove, the comparator 14 has any suitable number of inputs. Typically, the comparator 14 has a plurality of programmable inputs, a number of which are activated to receive data from the output lines of the digital delay element 12. For example, in the embodiment shown in FIG. 1, the digital delay element 12 has 4 output lines 32, 34, 36, 38. Thus, the comparator 14 will have 4 inputs activated to receive data from the 4 output lines, even though the comparator 14 may have more than 4 available inputs. In such an arrangement, the unused comparator inputs are not programmed to receive data. In this manner, the comparator 14 is configured to allow for increased or decreased filter bandwidth by activating the appropriate number of inputs, e.g., to coincide with the number of output liens from the digital delay element 12.

Referring now to FIG. 2, shown is a timing diagram associated with the operation of the digital filtering apparatus 10. The first line 61 ("clk") indicates the logical value (i.e., logical low or logical high) on the clock input line 24. As shown in the diagram, the clock pulse in this example has a frequency of 25 megahertz (MHz), or ten cycles per 400 nanoseconds (ns). The second line 62 ("reset n") indicates the logical value of the pre-set input line 26. The third line 63 ("valid") indicates the logical value of the valid or enable output line 52 of the comparator 14. The fourth line 64 ("data in") indicates the logical value of the data signal line 22 into the digital filtering apparatus 10. The fifth line 65 ("data out") represents the logical value of the output line 54 of the final stage 16, which output line 54, as discussed hereinabove, also serves as the filtered output of the digital filtering apparatus 10.

In operation, with reference to the timing diagram in FIG. 2, the digital filtering apparatus 10 is initialized using the reset input line 26 to initialize the flip-flops 42-48, the comparator 14 and the final stage 16. After initialization, the clock input line 24 clocks in the logical value of the data signal line 22, e.g., in a conventional manner. As the data from the data signal line 22 is clocked into the digital delay element 12, the logical value of the data passes sequentially through the individual delay components, e.g., flip-flops 42-48. In this manner, the information on the data signal line 22 is delayed by the digital delay element 12 for the number of clock cycles established by the clock cycle setting (i.e., the number of individual delay components minus 1). As discussed above, in this example embodiment, with 4 flip-flops in the digital delay element 12, the clock cycle setting is 3 clock cycles.

As the data is clocked through the digital delay element 12, the comparator 14 is comparing the output of each flip-flop 42-48. Unless the comparator 14 sees all zeroes (i.e., logical lows) or all ones (i.e., logical highs), the comparator 14 will not identify, recognize or validate the logical data state transition clocking through the digital delay element 12 as valid data. Because of the specific operable connection of the comparator 14 between the digital delay element 12 and the final stage 16, the comparator 14, upon recognition of valid data, enables the final stage 16 by causing the final stage 16 to latch in the logical value of the final flip-flop 48. Therefore, as long as any logical data state transition on the data signal line 22 ("data in") has a duration less than 3 clock cycles, the comparator 14 will not cause the final stage 16 to latch in the logical value of the final flip-flop 48, i.e., the data on the output line 38 of the digital delay element 12.

For example, as shown in FIG. 2, a first logical high to logical low transition (shown generally as 71) has a duration slightly les than 3 clock cycles, but not greater than 3 clock cycles. Thus, the first high to low transition 71 does not cause all the input lines 32-38 of the comparator 14 to be logical low at the same time, and therefore the comparator 14 does not recognize the data as valid data and does not enable the final stage 16. As shown, the logical value of the "data out" line 65 remains high and does not change states to logical low after the first high to low transition appears on the "data in" line 64. Similarly, a second high to low transition (shown generally as 72) has a duration less than 3 clock cycles, and thus is not recognized as valid data. As such, the comparator 14 does not validate and enable the final stage 16, and the logical value of the "data out" line 65 remains high and does not change to logical low after the second high to low transition appears on the "data in" line 64.

However, a third logical high to low transition (shown generally as 73) has a duration greater than 3 clock cycles, and will cause all the input lines inputs 32-38 of the comparator 14 to be low at the same time as they are clocked through the flip-flops 42-48 in the digital delay element 12. Thus, the comparator 14 recognizes the third high to low transition 73 as valid data and enables the final stage 16 via the enable output line 52. Upon being enabled, the final stage 16 latches in the logical high to low from the output of the final flip-flop 48 in the digital delay element 12. The connection between the output of the final flip-flop 48 and the input of the final stage 16 is shown generally as 75. Accordingly, the latched logical high to low appears on the output line 54 as a logical low, and is shown generally on the "data out" line 65 as 76.

As shown in the FIG. 2, the logical value of the "data out" line 65 changes states from logical high to logical low a short time after the end of the third logical high to low transition 73. The slight delay in the logical high to low transition on the "data out" line 65 after the end of the third logical high to low transition on the "data in" line 64 is attributed to normal propagation delays experienced in the operation of the circuit components in the filter circuit 10. Also, as discussed previously herein, FIG. 2 shows that the duration of the logical high to low 76 on "data out" line 65 is approximately equal to the duration of the third logical high to low transition 73.

As discussed previously herein, the "data out" line 65 represents the logical value of the output line 54 of the final stage 16, which also is the filtered output of the digital filtering apparatus 10. Accordingly, in the data example shown in FIG. 2, the digital filtering apparatus 10 recognized a logical high to low with a duration greater than 3 clock cycles (i.e., the third logical high to low 73) as valid data and provided a filtered output in the form of a high to low transition for a duration approximately equal to that of the valid data.

Referring now to FIG. 3, shown is another timing diagram associated with the operation of the digital filtering apparatus circuit shown in FIG. 1. Conversely, in this timing diagram, the output of the digital filtering apparatus 10, i.e., the "data out" line, remains a logical low until a valid low to high transition is detected or recognized. For example, a first logical low to logical high transition (shown generally as 81) has a duration less than 3 clock cycles and is considered invalid data. Thus, all the input lines 32-38 of the comparator 14 are not logical high at the same time, and therefore the comparator 14 does not enable the final stage 16. Accordingly, the "data out" line does not change states and remains a logical low. Similarly, both a second logical low to high transition (shown generally as 82) and a third logical low to high transition (shown generally as 83) have durations less than 3 clock cycles. As such, they are recognized as invalid data, and the "data out" line does not change states and remains a logical low through these transitions.

However, a fourth logical low to high transition (shown generally as 84) has a duration slightly greater than 3 clock cycles, and will cause all the input lines inputs 32-38 of the comparator 14 to be logical high at the same time. Thus, the comparator 14, which recognizes the fourth low to high transition 84 as valid data, enables the final stage 16 via the enable output line 52. The final stage 16 latches in the logical high output from the final flip-flop 48 in the digital delay element 12, and the "data out" line shows a logical low to high transition (shown generally as 91) for a duration approximately equal to the duration of the fourth low to high transition 84. Again, the logical low to high transition 91 occurs slightly in time after the end of the fourth logical low to high transition 84.

Similarly, a fifth logical low to high transition (shown generally as 85) has a duration greater than 3 clock cycles, and is recognized as valid data. Through the operation of the comparator 14 and the final stage 16, e.g., as discussed previously hereinabove, the "data out" line changes state from logical low to logical high (shown generally as 92) for a duration approximately equal to the duration of the fifth logical low to high transition 85 on the "data in" line.

It will be apparent to those skilled in the art that many changes and substitutions can be made to the embodiments of the invention herein described without departing from the spirit and scope of the invention as defined by the appended claims and their full scope of equivalents. For example, the invention could be applied to electrical communication distribution systems.

The invention claimed is:

1. A digital filtering apparatus for use with a data signal line, comprising:
   a digital delay element that receives data from a data signal line, the digital delay element having a plurality of delay components and at least one output;
   a comparator operably connected to the at least one output of the digital delay element in such a way that the comparator compares the output of each of the plurality of delay components, the comparator having an output; and
   a final stage operably connected to the output of the digital delay element and the output of the comparator,
   wherein the comparator, upon recognizing invalid data clocking through the digital delay element by determining that the output of each of the plurality of delay components are not the same logical state, enables the final stage to filter the data and wherein the comparator, upon recognizing valid data clocking through the digital delay element by determining that the output of each of the plurality of delay components are the same logical state, enables the final stage wherein the output of the final stage changes logical state for a duration approximately equal to that of the valid data.

2. The apparatus as recited in claim 1, wherein the digital delay element further comprises a plurality of shift registers operably connected in series.

3. The apparatus as recited in claim 1, wherein the digital delay element further comprises a plurality of flip-flops operably connected in series.

4. The apparatus as recited in claim 1, wherein the final stage further comprises a latch.

5. The apparatus as recited in claim 1, wherein the digital delay element has a clock cycle setting, and wherein invalid data comprises data that has changed logical state for a duration less than the clock cycle setting.

6. The apparatus as recited in claim 1, wherein the digital delay element further comprises a plurality of digital delay elements operably connected in series, and wherein the bandwidth of the filter is increased by increasing the number of digital delay elements operably connected in series and the bandwidth of the filter is decreased by decreasing the number of digital delay elements operably connected in series.

7. The apparatus as recited in claim 1, wherein the digital delay element has a plurality of output lines, wherein the comparator has a plurality of programmable input lines connected to the plurality of output lines of the digital delay element, and wherein the bandwidth of the filter is established by the number of comparator output lines that are programmed to receive data from the digital delay element.

8. A method for digitally filtering invalid data from a data signal line, comprising:
   delaying with a digital delay element having a plurality of delay components data from the data signal line;
   determining with a comparator valid data clocking through the digital delay element by verifying that the output of each of the plurality of delay elements are the same logical state; and transitioning logical data states of an output line in response to the comparator recognizing valid data, wherein the duration of the logical data state transition is approximately equal to the duration of the valid data.

9. The method as recited in claim 8, wherein the output line further comprises a final stage latch connected to the comparator, and wherein the transitioning step further comprises enabling the final stage latch.

10. The method as recited in claim 8, wherein the digital delay element further comprises a plurality of flip-flops connected in series, and wherein the delaying step further comprises clocking data from the data signal line through the plurality of flip-flops.

11. The method as recited in claim 10, wherein the filtering method has a bandwidth, and wherein the filtering method further comprises the step of adjusting the bandwidth of the filtering method by increasing or decreasing the number of flip-flops in the digital delay element.

12. The method as recited in claim 8, wherein the filtering method has a bandwidth, wherein the comparator has a plurality of programmable input lines connected to the digital delay element, and wherein the filtering method further comprises the step of adjusting the bandwidth of the filtering method by adjusting the number of the plurality of programmable input lines that can receive data from the digital delay element.

* * * * *